(12) United States Patent
Petkie

(10) Patent No.: US 6,830,780 B2
(45) Date of Patent: Dec. 14, 2004

(54) METHODS FOR PREPARING BRAZEABLE METALLIZATIONS FOR DIAMOND COMPONENTS

(75) Inventor: Ronald Petkie, Macungie, PA (US)

(73) Assignee: Morgan Chemical Products, Inc., Allentown, PA (US)

( * ) Notice: Subject to any disclaimer, the term of this patent is extended or adjusted under 35 U.S.C. 154(b) by 0 days.

(21) Appl. No.: 09/965,478

(22) Filed: Sep. 27, 2001

(65) Prior Publication Data

US 2002/0114963 A1 Aug. 22, 2002

Related U.S. Application Data

(63) Continuation-in-part of application No. 09/584,762, filed on May 30, 2000, now Pat. No. 6,531,226.
(60) Provisional application No. 60/137,264, filed on Jun. 2, 1999.

(51) Int. Cl.[7] ............................................. C23C 16/06
(52) U.S. Cl. .................. 427/255.7; 427/250; 204/192.1
(58) Field of Search .............................. 427/255.7, 250; 204/192.1

(56) References Cited

U.S. PATENT DOCUMENTS

| | | |
|---|---|---|
| 3,243,498 A | 3/1966 | Allen et al. |
| 3,351,543 A | 11/1967 | Vanderslice |
| 3,356,473 A | 12/1967 | Hull et al. |
| 4,117,968 A | 10/1978 | Naidich et al. |
| 4,342,632 A | 8/1982 | Heim et al. |
| 4,738,689 A * | 4/1988 | Gigl et al. ..................... 51/295 |
| 4,776,862 A | 10/1988 | Wiand |
| 4,899,922 A * | 2/1990 | Slutz et al. .................. 228/121 |
| 4,931,363 A | 6/1990 | Slutz et al. |
| 5,024,680 A | 6/1991 | Chen et al. |
| 5,224,969 A | 7/1993 | Chen et al. |
| 5,234,153 A | 8/1993 | Bacon et al. |
| 5,239,746 A | 8/1993 | Goldman |
| 5,250,086 A | 10/1993 | McEachron et al. |
| 5,324,987 A | 6/1994 | Iacovangelo et al. |
| 5,328,715 A | 7/1994 | Iacovangelo et al. |
| 5,348,108 A | 9/1994 | Scott et al. |
| 5,371,407 A | 12/1994 | Goldman |
| 5,382,758 A | 1/1995 | Iacovangelo et al. |
| 5,500,248 A | 3/1996 | Iacovangelo et al. |
| 5,529,805 A * | 6/1996 | Iacovangelo et al. ....... 427/249 |
| 5,567,985 A | 10/1996 | Iacovangelo et al. |
| 5,626,909 A * | 5/1997 | Iacovangelo ................ 427/250 |
| 5,804,321 A | 9/1998 | Thorpe et al. |
| 5,849,413 A | 12/1998 | Zhu et al. |
| 5,853,888 A | 12/1998 | Dutta et al. |
| 5,874,175 A * | 2/1999 | Li ................................ 428/457 |
| 6,068,070 A * | 5/2000 | Scott ........................... 175/428 |

FOREIGN PATENT DOCUMENTS

| | | |
|---|---|---|
| JP | 51-94771 A | 8/1976 |
| JP | 62-24647 | 2/1987 |
| JP | 2-226749 | 9/1990 |
| WO | WO 01/92185 A1 | 12/2001 |

OTHER PUBLICATIONS

Petkie, Ronald, "Packaging Aspects of CVD Diamond in High Performance Electronics Requiring Enhanced Thermal Management," *1998 International Symposium on Advanced Packaging Materials*, Mar. 15–18, 1998, pp. 223–228.

Jahangir, et al., "A highly adhesive gold–based metallization system for CVD diamond substrates," *Proceedings of the Sixth International Symposium (Electrochemical Society Proceedings)*, vol. 99–32, Honolulu, Hawaii, Oct. 17–22, 1999 (Abstract XP–002178784).

* cited by examiner

*Primary Examiner*—Bret Chen
(74) *Attorney, Agent, or Firm*—Bruce D. Gray; Dean W. Russell; Kilpatrick Stockton LLP

(57) ABSTRACT

A multilayer brazeable metallization structure for diamond components and method for producing it are described. The brazeable metallization finds particular application for the attachment of diamond components such as heat spreaders in electronic packages that incorporate high power semiconductor devices. In the present invention, a diamond component is provided with a multilayer coating of metals including depositing a first layer of chromium for adhesion onto at least a portion of the diamond component, depositing a second barrier layer of a refractory metal for a barrier onto at least portion of the chromium layer, and a top layer of copper, silver or gold for wetting. This top layer is thick (greater than 5 microns), without sacrificing resistance to delamination, particularly at brazing conditions. It is obtained by depositing a layer of a first metal onto at least a portion of the refractory metal layer, and depositing a layer of a second metal onto at least a portion of the first metal layer. The refractory metals for the barrier layer include tungsten, molybdenum, tantalum, niobium, or tungsten-chromium alloy. This multilayer metallization structure provides a robust interface between diamond and standard brazing alloys which are used to join the diamond to electrical leads or a flange made of metals such as copper-tungsten. The interfacial adhesion between the metallization and the diamond is sufficient to withstand exposure to brazing at temperatures less than or equal to 1,100° C. in inert gas atmospheres that may contain hydrogen.

22 Claims, No Drawings

METHODS FOR PREPARING BRAZEABLE METALLIZATIONS FOR DIAMOND COMPONENTS

This application is a continuation-in-part of U.S. Ser. No. 09/584,762, filed May 30, 2000, now U.S. Pat. No. 6,531,226 which claims priority to provisional application Ser. No. 60/137,264 filed Jun. 2, 1999, the entire contents of each of which are incorporated herein by reference.

FIELD OF THE INVENTION

This invention relates to fabricating brazeable diamond products and components for the microelectronic industry that are used as heat spreaders, heat conductors and electrical insulators in electronic packages. More particularly, the product of this invention relates to a multilayer metallization structure that allows diamond to be attached into electronic packages using conventional brazing operations. Still more particularly, the products for this invention have applications involving thermal management of high power semiconductor devices by the use of diamond.

BACKGROUND OF THE INVENTION

Integration of high power electronic devices into electronic systems typically requires the construction of an electronic package. An electronic package is typically comprised of a metal flange onto which is attached an electronic device ("chip"). In some package designs, it is important to insure that the chip does not electrically short to the metal flange, a layer of electrically insulating material is positioned between the device and the flange. A window frame or lead frame may be attached around the device. This frame enables electrical connections via wire bonds or other techniques from the chip to the outside of the package. For environmental protection of the chip, a cap attached over the flange may seal the package. The electronic package is then attached to a heat sink, which may be a metal element in contact with a cooling medium such as air, fluorocarbon liquid, and the like.

High power devices such as those used in high speed computing, microwave and RF telecommunications, and the like typically use ceramic materials such as aluminum oxide, beryllium oxide or aluminum nitride as materials. These materials are cut to shape from sheets, or molded to shape, and are readily attached into electronic packages using conventional solders or brazes. As the power electronic devices are miniaturized, and their power output is increased, their operating temperature is dramatically increased. These ceramic materials have relatively low thermal conductivity compared to diamond (aluminum oxide= 20 W/mK (watts/meter/° K), beryllium oxide=260 W/mK, aluminum nitride=170 W/mK). Therefore, they provide a relatively high thermal resistance between the chip and the flange, which ultimately limits the operating power and reliability of the chip.

Because of its properties, Chemical Vapor Deposition ("CVD") diamond is the ultimate electrical insulator for high power device applications. CVD diamond has extremely high electrical resistivity, high breakdown voltage and high thermal conductivity of 1,000 to 2,000 W/mK, up to four times that of copper. Because of its high thermal conductivity, a diamond layer of significant thickness (typically at least 200 microns thick) also functions as a heat spreader, effectively spreading the heat from the localized area at the chip to a larger area at the flange and ultimate heat sink. However, the use of diamond as an electrical insulator in high power electronic devices has been limited because of the cost of manufacturing diamond components, and the inability to reliably attach diamond into device packages using established methods.

Recently, as the manufacturing cost of diamond has declined with improved CVD synthesis techniques, the demand for diamond components has increased. The need for CVD diamond in high power density applications is rapidly increasing as the package sizes decrease and package power increases. Therefore, it is likely that if a robust method for attaching diamond into electronic packages could be developed, diamond heat spreaders and components would be used in almost every application where enhanced thermal management is vital to prolong the life of microelectronic packages. This is especially true for computer chips, associated power supplies and high-frequency telecommunications.

The two most common joining technologies that are used in microelectronic packaging are soldering and brazing. Each of these methods requires metallization of the components and subsequent heating to perform the attachment. Soldering is typically defined as attachment in which requires at temperature of less than 500° C. to melt metal layers and join the components, while brazing requires a temperature greater than 500° C. to melt the metal layers and join the components.

Solderable metallizations to diamond, such as a multilayer structure of titanium, platinum, gold, followed by gold-tin eutectic solder are well-established. An advantage to the solderable metallizations for diamond is the low attachment temperature, which minimizes thermal stresses resulting from the difference in thermal expansion coefficient between diamond and most materials, especially metals. However, due to the tendency of void formation in soldering, intimate thermal contact may be limited for large areas without specialized bonding techniques.

Brazing is the preferred attachment method for high power electronic packages since the high temperatures involved in the brazing process, typically around 800° C. or greater, usually ensure a very good wetting of the braze material at the interface between two components. It is important that there are no voided areas at the component interfaces that are involved in thermal transfer, since any voids would increase the overall thermal resistance of the package.

The interfaces joined by brazing are usually between the insulator, i.e., diamond, and electrical lead frame or flanges. The electrical leads must be able to pass a peel test, and hence the adhesion between the diamond and the leads must be extremely good. Typically, a peel strength of 2.0 pounds minimum at 90° is required for leads of 0.15" in width.

One of the established industrial methods of achieving interface wetting is the use of hydrogen in the atmosphere during the brazing process, since metal oxide formation is prevented. An eutectic alloy, such as Cu—Sil (72% silver, 28% copper), is commonly used for joining articles in brazing processes, but other brazeable materials such as pure copper and gold may be used as well. The Cu—Sil alloy melts at 780° C. and wets extremely well to nickel and copper surfaces in an atmosphere of nitrogen containing from 2% up to perhaps 75% hydrogen. Brazing temperatures for Cu—Sil are typically as high as 820° C.

To-date, it has been difficult to produce reliable brazeable metallization structures for diamond in microelectronic packages. These difficulties are due to the significant differences in the coefficient of thermal expansion between diamond and metals and also to the chemical nature of the metals comprising the metallization structure.

Many methods are currently known for fabricating diamond products suitable for electronic applications. However, they all have the disadvantage of not being able to withstand brazing temperatures, i.e., temperatures in the range of about 500 to 1,100° C.

Iacovangelo, et al., U.S. Pat. Nos. 5,324,987 and 5,500,248 describe the use of a diamond product for electronic applications, but which are not suitable for use at such brazing temperatures. One example of the disclosed product is a diamond having an adhesion-promoting material interposed between the diamond and the conductive metal, e.g. copper. The adhesion-promoting material is titanium or a titanium-tungsten alloy. It is believed that the metallization in such a product becomes delaminated when the temperature is increased to brazing temperatures in a standard hydrogen-nitrogen-containing brazing atmosphere because of hydride or nitride formation.

Iacovangelo, et al., U.S. Pat. No. 5,529,805 describe fabrication of brazeable diamond tool inserts using a substantially non-oxidizable nickel protective layer deposited onto a chromium metal layer bonded to the diamond component in a nitrogen-free atmosphere.

Iacovangelo, et al., U.S. Pat. No. 5,567,985 describe an electronic structure comprising a CVD diamond substrate, a tungsten-titanium bond layer, a silver compliant layer, a tungsten-copper layer and a gold solder bond outer layer. Such a structure is capable of surviving a thermal shock of temperature in the range of −65 to 150° C. However, such a structure is not capable of surviving brazing in nitrogen-containing atmosphere at temperatures in the range of about 750 to 1,100° C. without delamination.

From the above discussion it is clear that a diamond product and a method are needed for fabrication of a brazeable diamond component that is extremely robust in terms of adhesion to electrical leads and flanges. There is also a need a diamond component that may be strongly bonded to other package components in a hydrogen-containing and nitrogen-containing brazing atmosphere without delamination. If a hydrogen-containing brazing atmosphere is used, the diamond becomes electrically non-insulating provided that the brazing temperature is sufficiently high.

In addition, the risk of delamination of the metallizing layers, in particular as the material is later brazed, increases substantially as the thickness of the metallizing layer increases. As a result, the need for a reliable product, free from unnecessary risk of delamination, has caused the thickness of the metallizing layer to be limited to about 50,000 Å (about 5 $\mu$m). It would be very desirable to produce thicker metallization layers (ranging from about 5 $\mu$m to about 200 $\mu$m or higher) for high power circuitry on diamond substrates. Such thick metallization layers can also provide increased mechanical stability to the diamond substrate. These layers can also help to planarize the as-grown diamond surface, allowing more efficient heat transfer to or from attached electronic devices or heat sink flanges. This also allows attachment to the diamond of materials having high coefficients of thermal expansion, such as GaAs active electronic devices or copper heat sink flanges. Accordingly, a need exists in the art for diamond products having relatively thick metallization layers that have excellent resistance to delamination.

SUMMARY OF THE INVENTION

The product of the present invention includes a diamond component, a chromium metal adhesion layer, a refractory metal barrier layer covering the chromium layer, and a metal wetting layer for joining that covers the refractory metal layer. The diamond component used in the product of this invention is preferably a CVD diamond. Typically, the diamond component is grown in flat sheets to a specified thickness, then separated from the growth substrate. The diamond sheets are polished to the required thickness and surface roughness while the opposing surfaces are kept parallel within a given specification. Typical thickness is in the range of about 100 to 1000 micrometers, preferably about 300 to 500 micrometers. Typical average surface roughness of the diamond surface is 1,000 Å or less. Laser machining can be performed, if necessary, prior to metallization in order to make via holes ("vias") or define the diamond surface dimensions. The deposition of the metal layers is performed sequentially by vacuum deposition methods such as magnetron sputtering, thermal or electron beam evaporation, ion plating or CVD.

The method of the present invention for fabricating a brazeable diamond product comprising the steps of (a) depositing the chromium metal adhesion layer onto a surface of the diamond component described above so that the chromium metal layer and the diamond form a strong interface there between and have a thickness of about 150 to about 15,000 Å;

(b) depositing a barrier layer of the refractory metal onto the chromium metal adhesion layer and have a thickness of about 150 to about 15,000 Å;

(c) depositing an outer layer of a metal from the group consisting of copper, silver, gold and mixtures thereof onto the barrier layer; and (d) recovering a product having at least three layers deposited on the diamond for use in electronic packages.

The chromium metal is first deposited to cover the surface of the diamond that is to be brazed. Preferably the chromium layer has thickness in the range of about 200 to about 10,000 Å. The optimum thickness for complete chromium coverage is at least about 1,000 Å. Preferably the refractory metal barrier layer is deposited to a thickness in the range of about 200 to about 10,000 Å. For the barrier layer to achieve optimum performance, and complete coverage of the chromium adhesion layer, the optimum thickness is at least about 1000 Å. The refractory metal barrier layer comprises tungsten, molybdenum, tantalum, niobium, a chromium alloy of the refractory metal, and mixtures thereof. The chromium alloy has about 1 to 20 atomic weight chromium. Tungsten and tungsten-chromium alloys are preferred refractory barrier layers. Finally, the outer or top layer of metal that wets to the braze material, such as copper, silver, gold, is deposited to a thickness from about 200 to 50,000 Å, depending on the particular metal and the brazing temperature. Preferably, the outer layer is copper or silver with a thickness of about 20,000 Å. When the outer layer is gold, preferably the thickness is in the range of about 200 to about 2,000 Å.

The top layer provides a joining layer, contributes to the electrical conduction required in the design of the electronic package, and remains virtually insoluble with the diffusion barrier layer. Because copper, silver and gold are also relatively soft in terms of yield strength, this top layer is somewhat compliant, which lends itself to the robust nature of the metallization when joining materials with a large difference in the coefficient of thermal expansion. The resulting metalized multilayers of the electronic package are easily chemically or sputter etched by conventional photolithographic methods for electrical isolation of devices.

In another embodiment, the invention relates to a diamond component that has been coated with a layer of chromium metal, as described above. The chromium metal layer has been coated with a layer of refractory metal, selected from the group consisting of tungsten, molybdenum, tantalum, niobium, a chromium alloy of one of the above refractory metals, and mixtures thereof, also as described above. The refractory metal layer has been coated with a layer of a first metal selected from the group consisting of copper, silver, gold, or mixtures thereof. This layer of first metal has been coated with a layer of a second metal (which may be of the same metal as the first), selected from the group consisting of copper, silver, gold, or mixtures thereof. The total thickness of the metallization layers (first and second metals) is generally larger than about 5 microns, more particularly, generally about 50 microns or larger, and may be as large as 200 microns or larger. These thicknesses of metallization layer are achieved with excellent resistance to delamination at brazing temperatures. The maximum allowable thickness of the copper metallization which avoids excessive bowing or cracking of the diamond, will depend on the dimensions of the diamond (thickness and footprint area) with smaller and thicker diamond wafers allowing thicker metallization layers.

The metallized product of this embodiment of the invention is produced by depositing a layer of chromium metal onto at least a portion of a surface of a diamond component; depositing onto at least a portion of the surface of the layer of chromium metal a layer of a refractory metal selected from the group consisting of tungsten, molybdenum, tantalum, niobium, a chromium alloy of said refractory metal, and mixtures thereof; depositing onto at least a portion of the layer of refractory metal a layer of a first metal selected from the group consisting of copper, silver, gold, and mixtures thereof; and depositing onto at least a portion of the layer of first metal a layer of a second metal selected from the group consisting of copper, silver, gold, and mixtures thereof by contacting the first metal with the second metal at a temperature at or above the melting point of the second metal, e.g., by placing a film or foil or shim of the second metal onto the surface of the first metal layer and heating the film or foil or shim to a temperature above the melting point of the second metal for a time sufficient to melt at least a portion of the second metal.

In a modification of this embodiment, the third layer of coating can be eliminated, and the second metal becomes an outer metal layer that is brought into contact with the refractory metal layer at a temperature at or above the melting point of the outer metal. When at least a portion of the outer metal is in molten form, and contacts the refractory metal layer, a thick metallization with good resistance to delamination will also occur.

DETAILED DESCRIPTION OF THE INVENTION

The present invention substantially reduces or eliminates the disadvantages and shortcomings associated with the prior art techniques by providing for the deposition of the multilayers of metals that form a brazeable diamond structure. Optionally after the deposition of the multilayer structure, the coated diamond may be annealed by heating to temperatures of about 850° C. for a time such as about 3 minutes. Although this step is unnecessary, it is believed to form an interfacial chromium carbide layer that produces a more robust adhesion and stabilizes the metallization structure for subsequent high temperature processing.

In another embodiment of the method of the present invention, vias in diamond that contain brazeable metallization structures are formed. First, vias in diamond are typically made by laser machining. The shape of vias may have any cross-sectional shape, such as circular or square. The typical vias are cylindrical. The vias may also include the tapering such that the wall of the vias are not perpendicular to the plane of diamond surface, but rather at an angle. The purpose of making the via walls tapered is to increase the amount of material deposited during physical vapor deposition. Tapering the via walls increases the capture cross-section of the vias walls with respect to the material vapor stream during processing in a vacuum chamber operating at less than $1 \times 10^{-5}$ Torr.

Secondly, whereas the purpose of vias are for electrical conduction through the structure, the vias walls are coated with an interfacial layer that provides an adhesion interface between the diamond and any electrically conductive material used for filling the vias that is suitable for the particular application. This is accomplished by first depositing onto the via walls a multilayer metallization structure that is capable of withstanding the aforementioned brazing environment. For example, the multilayer brazeable metallization structure of the present invention can be deposited onto the side of the diamond with tapered vias such that the vias are exposed with their widest diameter towards the deposition flux. A heat treating process is performed to stabilize the bond between of this interfacial coating to the diamond via walls. This is typically done at temperatures in the range of about 800 to 1,000° C. in pure argon or nitrogen, either of which may contain 4% hydrogen, for 2 to 10 minutes.

Thirdly, a conductive material made from any combination of the more conductive family of metals, such as copper, silver, or gold, is placed into the vias by a number of methods. Methods may include, but not limited to, electroplating or screenprinting. These methods are both economical in terms of manufacturing.

In the case of screen-printing, a metal stencil is generally used to print a thick film paste, containing metals, oxides and/or frits, and organic components, into the vias by proper alignment of the apertures in the stencil with the vias. The paste becomes conductive after the organic constituents are removed by firing at high temperatures, usually above 300° C. Oxides and/or glass frits in the paste reduce the shrinkage of the paste upon firing due to volatile organic components and reduce the coefficient of the thermal expansion of the conductive material. The thick film pastes are typically fired (sintered) at 800 to 1,000° C. to become cohesive and to bond to the brazeable metallization structure of the present invention. The process of filling vias by stencil printing and firing may be repeated until the vias in the structure are satisfactorily filled by the conductive component of the paste after firing off the organic components.

EXAMPLES

The following examples are provided to enable those skilled in the art to clearly understand and practice the present invention. These examples of sample preparation and deposition should not be considered as a limitation in the scope of the present invention, but merely as a set of illustrative examples thereof. In the examples below, sheets of polycrystalline CVD diamond, grown by the method of hot filament chemical vapor deposition, were polished to an average surface roughness of 300 Å on one side and 1,000 Å on the other side. After polishing, the structures were cleaned in a mixture of hydrofluoric acid and nitric acid to remove contaminants and heated treated in air at 500° C. for one hour to remove organic residue and graphitic carbon from the diamond surface. After this treatment, the CVD diamond was metalized in a vacuum chamber.

Example 1

Diamond components were prepared as described above and were mounted onto a rotating substrate platen in a vacuum chamber, equipped to sputter-deposit up to three different metal layers by DC magnetron sputtering. The vacuum chamber was evacuated to a base pressure of less than about $1\times10^{-6}$ Torr. Prior to deposition of the metal layers, the diamond components were sputter-etched by a beam of argon ion generated in a Kaufman-type ion source. The metal layers were deposited on the diamond components with <300 Å (mirror) and <1,000 Å (matte) average surface roughness in the following sequence: (1) 1,000 Å of chromium, (2) 1,000 Å of tungsten-chromium alloy (5 atomic % chromium) and (3) 12,000 Å of copper as the top layer. Upon completion of the deposition of the three layer metallization structure on the diamond components, the vacuum chamber was vented, and the metalized components were removed.

Example 2

Metallized diamond components with 300 Å average surface and 1,000 Å average surface roughness were prepared by the procedure described in Example 1, except the metal layers were deposited in the following sequence: (1) 1,000 Å of chromium, (2) 1,000 Å of tungsten-chromium alloy (5 atomic % chromium) and (3) 12,000 Å of silver as the top layer.

Example 3

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten and (3) 12,000 Å of copper as the top layer.

Comparative Example 4

Metallized diamond components with 300 Å and 1,000 Å average surface roughness were prepared by the procedure described in Example 1, except the metal layers were deposited in the following sequence: (1) 1,000 Å of chromium, (2) 1,000 Å of tungsten, (3) 300 Å of chromium, and (4) 12,000 Å copper as the top layer.

Comparative Example 5

Metallized diamond components with 300 Å and 1000 Å average surface roughness were prepared by the procedure described in Example 1, except the metal layers were deposited in the following sequence: (1) 1,000 Å of chromium, (2) 1,000 Å of tungsten, (3) 150 Å of chromium, (4) 12,000 Å of copper as the top layer.

Example 6

Metallized diamond components with 300 Å average surface roughness were prepared by the procedure described in Example 1, except the metal layers were deposited in the following sequence:

(1) 1,000 Å of Cr,
(2) 1,200 Å of W—Cr alloy (5 atomic % Cr),
(3) 110 Å Au,
(4) 400 Å of W—Cr alloy (5 atomic % Cr),
(5) 225 Å of Au,
(6) 400 Å of W—Cr alloy (5 atomic % Cr),
(7) 450 Å of Au,
(8) 400 Å of W—Cr alloy (5 atomic % Cr),
(9) 900 Å of Au,
(10) 400 Å of W—Cr alloy (5 atomic % Cr),
(11) 1,800 Å of Au,
(12) 400 Å of W—Cr alloy (5 atomic % Cr),
(13) 3,600 Å of Au,
(14) 400 Å of W—Cr alloy (5 atomic % Cr),
(15) 7,800 Å of Au,
(16) 400 Å of W—Cr alloy (5 atomic % Cr),
(17) 16,000 Å of Au as the top layer.

In all of the above examples, the metallized diamond components were heated at 800 to 825° C. for 5–10 minutes in an atmosphere containing pure argon, nitrogen, or 4% hydrogen in nitrogen prior to brazing. However, this heat-treating step is considered optional. In addition, samples from the experiments were mounted with Cu—Sil alloy preforms between the metallized surface of the diamond and a copper-tungsten flange or a lead comprised of nickel or Alloy 42. The assembly was placed in a brazing furnace, with an atmosphere containing argon, nitrogen, or 4% hydrogen in nitrogen for 5 minutes to join the diamond with the other metal or metallized components. In all examples, the adhesion between the components was found to be very strong and no delamination occurred.

After about ten minutes of the heat-treating step, chromium migrated or diffused to the surface of the metallized diamond component in Comparative Example 4. This migration inhibits the wettability of the product. By diminishing the thickness of the chromium layer as in Comparative Example 5, there were fewer tendencies for the chromium to migrate to the surface. However, the additional step of adding a chromium layer between the transition metal layer and the outer layer has been found to be unnecessary to achieve the desired adhesion strength and avoids the risk of chromium migration to the outer surface.

In all of the above examples, both faces of the diamond were sequentially coated and the top metal, being either copper, silver, or gold, is compatible with the braze alloy Cu—Sil. The metallized diamond component from Example 6 has also been verified to have excellent brazing performance in a manufacturing environment utilizing a belt furnace with an atmosphere of 4% hydrogen in nitrogen, using dwell times in the range of about 5 to 15 minutes in the belt furnace, preferably about 10 minutes, at temperatures of about 780 to 820° C.

It was originally believed that the adhesion strength of leads brazed to the metallized diamond component is influenced by the amount of chromium available at the interface between the tungsten and the copper layers. Therefore during the initial experimental work, an intermediate chromium layer was deposited between the refractory metal and the outer metal layer to ensure adhesion as indicated in Comparative Examples 4 and 5. The thickness of the chromium layer was kept to a minimum to avoid contaminating the copper surface. In order to determine the role of chromium in the adhesion strength, two types of metallizations were deposited on two types of diamond surface finishes. One metallization contained a tungsten-chromium alloy as a combined diffusion barrier and adhesion promoter (5 atomic % Cr), while the other metallization contained a pure tungsten barrier. This result allowed answers to the following questions: (1) whether the chromium in the primary adhesion layer of the structure was able to out-diffuse through the tungsten barrier to the outer metal layer and promote adhesion? or (2) whether it was necessary either to have a separate pure chromium layer between the barrier layer and the outer layer or to have chromium in the barrier layer?

Mirror and matte finishes were used for the diamond surfaces in the examples. The smoother mirror surface is used for die attachment, while the rougher matte surface is used for attaching to a flange or other heat sink material. The surface roughness variations for a standard mirror finish is <300 Å and for a matte finish is <1,000 Å. Leads made of Alloy 42 (a commercially available 42% nickel-48% iron alloy) with two variations in lead width (0.050" and 0.100") were brazed onto the metallized diamond surfaces with Cu—Sil.

The peel strength of the leads for Examples 1–3 and Comparative Examples 4–5 are set forth Table I below. The peel strength results for Examples 1 through 3 were performed by the Quad Group, Inc. using a standard 90° Rigid Substrate Peel Test in which a Romulus IV Universal Mechanical Strength Tester was used. The Peel Test that was used is substantially the same as that described in the product brochure for the Romulus III Mechanical Strength Tester dated March 1999.

TABLE 1

| Examples and Comparative Examples | Sample | Surface Finish | 0.050" width lead (lb.) | Avg. Value (lb.) | 0.100" width lead (lb.) | Avg. Value (lb.) |
|---|---|---|---|---|---|---|
| Example 1 | 2 | Mirror | 5.01 | NA | 9.11 | NA |
| Cr/W—Cr/Cu | 3 | Matte | 5.81 | | 9.41 | |
| 0.1/0.1/1.2μ | 4 | Matte | 5.3 | 5.6 | 6.94 | 8.2 |
| Example 2 | 5 | Matte | 1.7 | NA | — | |
| Cr/W—Cr/Ag | 6 | Matte | — | | 5.95 | 5.62 |
| 0.1/0.1/1.2μ | 7 | Matte | — | | 5.29 | |
| | 8 | Mirror | — | | 6.9 | NA |
| | 9 | Mirror | 3.04 | NA | — | |
| Example 3 | 10 | Matte | 6.6 | | 6.89 | |
| Cr/W/Cu | 11 | Matte | 4.33 | 4.4 | 8.65 | 7.9 |
| 0.1/0.1/1.2μ | 12 | Matte | 2.17 | | 8.19 | |
| | 13 | Mirror | 5.69 | NA | 9.66 | NA |
| Comparative | 14 | Mirror | NA | NA | At least 3* | NA |
| Example 4 Cr/W/Cr/Cu 0–1/0.1/0.03/1.2μ | 15 | Matte | NA | NA | NA | |
| Comparative | 16 | Mirror | NA | NA | At least 3* | NA |
| Example 5 Cr/W/Cr/Cu 0–1/0.1/0.015/1.2μ | 17 | Matte | NA | NA | NA | NA |

Notes:
1. W—Cr = 5 atomic % chromium.
2. Leads are Alloy 42.
3. Time was 5–6.5 minutes of dwell at 820° C.
*For a 0.15" nickel lead.
NA = not available.

Comparing the peel test results for Examples 1 and 3 in the above table, the results are essentially identical in terms of robustness. The alloy of 5% chromium in tungsten that was utilized in place of pure tungsten in Example 1 provides no significant improvement in peel strength for these types of metallization structures. This is most likely an indication that Cr has sufficiently diffused through the W barrier to promote adhesion. This implies that an additional layer of chromium between the barrier layer and the outer layer is not essential to obtaining robust adhesion for this structure. Thus, a structure that is Cr/W/Cu appears to be sufficiently robust given the time and temperature of the brazing. This chromium-tungsten alloy, however, simplifies the fabrication of a brazeable gold layer structure, where a relatively thick layer of gold is used, as in Example 6

Although the number of data points obtained in Example 2 for Ag as the outer layer is somewhat less, Ag also appears to work well when substituted for Cu of the Example 1 metallization scheme. Since the peel strength is only slightly less than for Cu, Ag also has favorable mechanical properties. Typically, 2.0 pounds of peel strength at 90° is acceptable for leads of 0.15" width.

As described above, another embodiment of the invention relates to brazeable diamond products and methods for making them wherein the layer of copper, silver, or gold is much thicker than previously thought possible. This layer is typically thicker than about 5 microns, and more particularly, may be thicker than about 10 microns, even more particularly greater than about 50 microns. It is possible to obtain layers of at least 75 microns, 100 microns, 150 microns, or 200 microns, or thicker. As described above, a three-layer coating is first deposited on the diamond substrate (the function of the third vacuum deposited layer is to prohibit oxidation of the second vacuum deposited layer. It is possible that only the first and second vacuum deposited layers are required.), and contacting the outer layer of this coating with a second metal in sufficient amount and at a temperature at or above the melting point of the second metal, to deposit the desired thickness of metal onto the coated substrate. Desirably, this contact with the second metal is accomplished by preparing a film, foil, or shim of the metal of the desired size and thickness, and disposing it adjacent to the outer coating layer of the substrate. The material is then heated to a temperature at or above the melting point of the metal shim, and maintained at this temperature for a time sufficient for the metal film, foil, or shim to at least partially melt, and bond to the third layer of the coating.

Desirably, the second metal is the same metal as is used in the third coating layer. Copper has been found to be a particularly suitable metal in this regard, and is used in the example below; it will be recognized that silver or gold could also be used. When applied as a film, foil, or shim, a thickness between about 10 and about 200 microns is used, but may range between about 20 and about 200 microns, between about 50 and about 200 microns, between about 75 and about 200 microns, between about 100 and about 200 microns, or between about 150 and about 200 microns depending on the thickness and area of the diamond wafer.

When a copper shim is used, the combination of coated diamond substrate and copper shim is heated in a furnace in an inert or reducing atmosphere to a temperature at or above the melting point of the copper, i.e., at or above about 1100° C., for a time sufficient to melt some or all of the copper shim. Without wishing to be bound by any theory, it is believed that contact of the coated substrate with molten metal from the shim or from the third layer (which can also become molten at the temperature at or above the melting point of the second metal) is significant in achieving a thick metallization without significant risk of delamination. This may occur because the molten metal in the shim or the outer layer of coating helps to "wet" the barrier refractory metal layer. It will be understood that the complete melting of the copper shim may result in some flow of copper across the surface of the coated diamond substrate, so that the thickness of copper may not be completely uniform. However, the addition of the thick metallization layer planarizes the coated surface, adds mechanical stability, allows attachment of materials with high coefficients of thermal expansion to the coated substrate, and provides for more efficient heat transfer from/to attached electronic devices or heat sinks.

Example 7

CVD diamond was grown on a substrate to a thickness of approximately 1000 microns and the substrate removed to form a free-standing, unpolished diamond wafer (the process will also function effectively on polished wafers). The diamond wafer was laser cut to a 8 mm diameter and mounted on a rotating substrate platen in a vacuum chamber equipped to sputter deposit metal coating layers by DC magnetron sputtering. The vacuum chamber was evacuated to a base pressure of less than about $1\times10^{-6}$ Torr. The substrate side of the diamond was used to receive the coatings described below, although the process is applicable to either side. This side of the wafer was sputter-etched by a beam of argon ion generated in a Kaufman-type ion source. A layer of chromium was deposited onto the surface of the diamond wafer by magnetron sputtering to a thickness of about 2000 angstroms. A layer of tungsten was then deposited onto the surface of the chromium layer by magnetron sputtering to a thickness of about 3000 angstroms. A layer of copper was deposited onto the tungsten layer by magnetron sputtering to a thickness of about 10,000 angstroms.

A copper shim was prepared, having a thickness of about 500,000 angstroms and a diameter slightly smaller than that of the diamond wafer (i.e., about 7 mm). The shim was disposed on the wafer adjacent to the sputter-deposited layers, and the wafer and shim introduced into a furnace, where they were heated in an atmosphere of flowing hydrogen (4–5%) in argon gas to a temperature of about 1100° C. for a time sufficiently long to melt the copper (approximately 1 minute). The wafer was then allowed to cool back to room temperature in the flowing hydrogen/argon gas mixture, which took approximately 45 minutes.

The resulting metallized wafer had a totally adherent, lustrous layer of copper metallization that varied in thickness up to approximately 110 microns. The adhesion was tested by thermally cycling the sample 4 times between room temperature and 800° C. for 5 to 10 minutes per cycle in an argon/hydrogen atmosphere. No delamination was observed.

Without departing from the spirit and scope of this invention, one of ordinary skill in the art can make various changes and modifications to the invention to adapt it to various usage and conditions. As such, these changes and modifications are properly, equitably, and intended to be, within the full range of equivalents of the following claims.

What is claimed is:

1. A method for fabricating a brazeable diamond product, comprising:
   (a) depositing a layer of chromium metal onto at least a portion of a diamond component;
   (b) depositing onto at least a portion of the layer of chromium metal a layer of a refractory metal selected from the group consisting of tungsten, molybdenum, tantalum, niobium, a chromium alloy of said refractory metal, and mixtures thereof;
   (c) depositing onto at least a portion of the layer of refractory metal a layer of a first metal selected from the group consisting of copper, silver, gold, and mixtures thereof, and
   (d) depositing onto at least a portion of the layer of first metal a layer of a second metal selected from the group consisting of copper, silver, gold, and mixtures thereof, by contacting the first metal with the second metal at a temperature at or above the temperature at which the first and another.

2. The method of claim 1, wherein the first and second metals are the same.

3. The method of claim 2, wherein the first and second metals are copper.

4. The method of claim 1, wherein the depositing of the layer of chromium metal comprises physical vapor deposition (PVD).

5. The method of claim 4, wherein the physical vapor deposition comprises sputtering.

6. The method of claim 1, wherein the depositing of the layer of refractory metal comprises physical vapor deposition.

7. The method of claim 6, wherein the physical vapor deposition comprises sputtering.

8. The method of claim 1, wherein the depositing of the layer of first metal comprises physical vapor deposition.

9. The method of claim 8, wherein the physical vapor deposition comprises sputtering.

10. The method of claim 1, wherein the depositing of the layer of second metal comprises applying a solid film, foil, or shim of the second metal to at least a portion of the surface of the first metal, and increasing the temperature of the film, foil, or shim to a temperature of about 780° C. to about 1100° C. for a time sufficient to cause at least a portion of the second metal to bond to the first metal.

11. The method of claim 10, wherein the film, foil, or shim of the second metal has a thickness of at least about 50 microns.

12. The method of claim 10, wherein the first metal and second metal are both copper, and wherein the solid film, foil, or shim is heated to a temperature of at least about 1100° C. in an inert or reducing atmosphere for a time sufficient to melt at least a portion of the solid film, foil, or shim.

13. A method for fabricating a brazeable diamond product, comprising:
   (a) depositing a layer of chromium metal onto at least a portion of a diamond component;
   (b) depositing onto at least a portion of the layer of chromium metal a layer of a refractory metal selected from the group consisting of tungsten, molybdenum, tantalum, niobium, a chromium alloy of said refractory metal, and mixtures thereof,
   (c) depositing onto at least a portion of the layer refractory metal a layer of an outer metal selected from the group consisting of copper, silver, gold, and mixtures thereof, by contacting the refractory metal with the outer metal at a temperature at or above the temperature at which the first and second metals bond with one another.

14. The method of claim 13, wherein at least a portion of the outer metal in contact with the refractory metal is molten.

15. The method of claim 13, wherein the outer metal is copper.

16. The method of claim 13, wherein the depositing of the layer of outer metal comprises applying a solid film, foil, or shim of the outer metal to at least a portion of the surface of the refractory metal, and increasing the temperature of the film, foil, or shim to a temperature at or above the melting temperature of the outer metal for a time sufficient to melt at least a portion of the outer metal.

17. The method of claim 16, wherein the film, foil, or shim of the second metal has a thickness of at least about 50 microns.

18. The method of claim 1, further comprising: brazing the brazeable diamond product to an electronic package component.

19. The method of claim 18, further comprising: attaching the electronic package component to a heat sink.

20. A method for fabricating a brazeable diamond product. comprising:
   (a) depositing a layer of chromium metal onto at least a portion of a diamond component;
   (b) depositing onto at least a portion of the layer of chromium metal a layer of tungsten or an alloy of tungsten;
   (c) depositing onto at least a portion of the layer of tungsten a layer of copper or an alloy of copper,
   (d) depositing onto at least a portion of the layer of copper, silver, gold or mixtures thereof.

21. The method of claim 20, wherein the layer of copper, silver, gold or mixtures thereof comprises a thickness of at least about 10 microns or greater.

22. The method of claim 21, wherein the layer of copper, silver, gold or mixtures thereof comprises a thickness of at least about 50 microns or greater.

* * * * *